United States Patent [19]

Bates et al.

[11] Patent Number: 4,542,535
[45] Date of Patent: Sep. 17, 1985

[54] R.F. BALANCED MIXER

[75] Inventors: Robert N. Bates, Redhill; Philip M. Ballard, Crawley, both of England

[73] Assignee: U.S. Philips Corporation, New York, N.Y.

[21] Appl. No.: 521,492

[22] Filed: Aug. 8, 1983

[51] Int. Cl.[4] .............................................. H04B 1/26
[52] U.S. Cl. ................................... 455/327; 455/328
[58] Field of Search .............. 455/327, 330, 328, 325, 455/326

[56] References Cited

U.S. PATENT DOCUMENTS

| | | | |
|---|---|---|---|
| 4,032,849 | 6/1977 | Gysel et al. | 455/325 |
| 4,291,415 | 9/1981 | Buntschuh | 455/328 |
| 4,406,020 | 9/1983 | Reindel | 455/327 |

OTHER PUBLICATIONS

"4 and 5 mm. Band Printed Circuit Balanced Mixers'-'—P. Weier—Aug. 1979 Microwave Journal, pp. 66–68.
"W—Band Broadband Integrated Circuit Mixers'-'—Tahim et al.—May 27, 1982 Electronics Letters, vol. 18, No. 11, pp. 471–473.
"A novel Broadband Double Balanced Mixer for the 18–40 GHz Range—A. Blaisdell et al., 1982 IEEE MTT-S Digest, pp. 33–35.

Primary Examiner—Marc E. Bookbinder
Attorney, Agent, or Firm—Robert J. Kraus

[57] ABSTRACT

An R.F. balanced mixer comprises on an insulating substrate (3) with opposed major surfaces a balanced first transmission line having a pair of conductors (18, 19) on a first major surface and an unbalanced second transmission line having a strip conductor (15) on one major surface and a ground conductor (13) on the side of the substrate (3) remote from the strip conductor (15). Two diodes (24, 25) are electrically connected between the pair of conductors (18, 19) of the first line and the strip conductor (15) of the second line to form an arrangement operable as a 180° hybrid junction, the first line coupling an R.F. signal to the diodes (24, 25) and the second line coupling an L.O. signal to and an I.F. signal from the diodes (24, 25). To reduce the impedance of the I.F. signal ground return path and inhibit resonant effects, the pair of conductors (18, 19) of the first line to which the diodes (24, 25) are respectively connected are on the same major surface as the strip conductor (15) of the second line and are coupled to the ground conductor (13) of the second line by means which include conductive connections (e.g. 33, 34) through the substrate (3) and which present a low impedance to the L.O. and I.F. signals.

7 Claims, 6 Drawing Figures

R.F. BALANCED MIXER

BACKGROUND OF THE INVENTION

The invention relates to an R. F. balanced mixer comprising insulating substrate means having two opposed major surfaces. The mixer has first and second transmission lines, wherein the first transmission line is a balanced transmission line comprising a pair of spaced conductors on a first of said major surfaces, and wherein the second transmission line is an unbalanced transmission line comprising a strip conductor on one of said major surfaces and a ground conductor on the side of the substrate remote from said strip conductor. The mixer further includes two diodes respectively conductively connected to and between the strip conductor of the second transmission line and the pair of spaced conductors of the first transmission line. The arrangement of the first and second transmission lines and the diodes operate as a 180 degree hybrid junction. In operation the first transmission line couples a signal at a first frequency to or from the diodes, and the second transmission line couples a signal at a second frequency to the diodes and couples a signal at a third frequency equal to the difference between the first and second frequencies to or from the diodes.

Such a mixer is known from U.S. Pat. No. 3,939,430. This patent discloses a single-balanced mixer the R. F. circuit of which includes three transmission lines utilising a conducting film on a first major surface of a dielectric substrate, namely a slot line, a coplanar line (sometimes known as a coplanar waveguide), and a microstrip line. The conducting film forms a ground plane in which the slot line is defined, and forms both the central conductor and the outer, ground conductors of the coplanar line, the elongate central conductor being separated by a circumferential gap from the transversely-opposed ground conductors. The conducting film also forms the ground plane of the microstrip line which further comprises a strip conductor on the other major surface of the substrate. One end of the slot line is coupled to one end of the coplanar line, the slot and gap of the respective lines together forming a continuous conductor-free region. The other end of the coplanar line is coupled to one end of the microstrip line, the central conductor of the coplanar line being connected by a conductive pin extending through the substrate to the strip conductor of the microstrip line. At the junction of the slot line and the coplanar line, two diodes are connected in opposite electrical polarities between the central conductor of the coplanar line and, respectively, two regions of the slot line ground plane lying respectively on opposite sides of the slot. This junction arrangement operates as a 180° hybrid junction (see also, for example, U.S. Pat. Nos. 3,678,395 and 4,032,849, and the paper "A 26.5-to-40 GHz Planar Balanced Mixer" by U. H. Gysel, Proceedings of the 5th European Microwave Conference, September 1975, pages 491–495).

In operation, a received R.F. signal is supplied to the junction by the slot line, while the microstrip line and the coplanar line serve to supply a local oscillator (L.O.) signal to and extract an intermediate frequency (I.F.) signal from the junction. A constructed embodiment described in the patent operated with an R.F signal frequency of 9.4 GHz and L.O. signal frequency of 7.8 GHz, giving an I.F. signal frequency of 1.6 GHz.

SUMMARY OF THE INVENTION

It is an object of the invention to provide an advanced mixer which is particularly suitable for operation at higher frequencies, for example with millimeter wavelength signals, and which has a relatively wide instantaneous I.F. signal bandwidth.

According to the invention, an R.F. balanced mixer as set forth in the opening paragraph is characterised in that the strip conductor of the second transmission line is on the first major surface of the substrate means and in that the pair of spaced conductors of the first transmission line are each coupled through the substrate means to the ground conductor of the second transmission line by coupling means which comprise conductive connection means extending through the substrate means from each of the spaced conductors to the ground conductor and which present a low impedance at the second and third frequencies.

The invention is based on the recognition that while the conductive connection through the substrate from the coplanar line to the strip conductor of the microstrip line in the above-mentioned prior-art mixer may be adequate at microwave frequencies, for example at X-band, and indeed is particularly suitable for signals of lower frequencies, for example at I.F. signal of relatively low frequency, it nevertheless constitutes a discontinuity in the transmission path of the L.O. and I.F. signals, the disadvantageous effect of which may become significant at higher frequencies, for example for an L.O. signal in the 60–90 GHz band. This may be mitigated by providing the strip conductor of the second transmission line on the same surface of the substrate as the pair of spaced conductors of the first transmission line (the diodes being respectively connected to these conductors), thereby enabling the discontinuity in the conductive connection between the strip conductor and the diodes to be at least alleviated, and instead providing coupling means including conductive connection means through the substrate between the pair of spaced conductors of the first line and the ground conductor of the second line. The ground conductor is necessarily of greater width than the juxtaposed strip conductor, and hence permits substantial capacitive coupling, which is especially significant as the frequency increases.

The coupling means presents the low impedance at the second frequency over a broad range of values thereof. This is particularly appropriate when it is desired to operate the same mixer circuit configuration with different local oscillator signal frequencies, for example to cover a broad band of incoming R.F. signal frequencies.

In a mixer embodying the invention wherein each of the pair of spaced conductors overlaps the ground conductor over a substantial respective area to provide substantial capacitive coupling, each of the conductive connection means is distributed in or at the periphery of the respective area whereby to reduce the inductance of the conductive connection means. Each of the conductive connection means is for example distributed discretely in a plurality of spaced locations; alternatively or additionally, each of the conductive connection means may be distributed continuously linewise.

Each conductive connection means may be disposed so as to substantially minimize the conductive path length between each diode and a region of the ground conductor substantially juxtaposed to an end of the strip conductor adjacent the diodes.

In an embodiment of the invention comprising a housing for the substrate means, the housing comprising conductive material, wherein the ground conductor is a ground plane on the second major surface of the substrate means, suitably the diodes are conductively connected to two respective portions of the ground plane, which portions, for biasing of the diodes, are mutually D.C.-isolated by slot means in the ground plane, and the two portions are mutually R.F.-coupled by capacitive coupling via the conductive material. Such an arrangement is for example particulalry suitable when the substrate extends in an E-plane of a waveguide in the housing, the first and second transmission lines being coupled to the waveguide at the first and second frequencies respectively.

It may be noted that R.F. balanced mixers as set forth in the opening paragraph of this specification, wherein the strip conductor of the second transmission line is on the same major surface of the substrate as the pair of spaced conductors of the first transmission line, are known from several publications comprising the following references:

(1) "Millimeter Wave Finline Balanced Mixers" by R. N. Bates andand M. D. Coleman, Proc. 9th European Microwave Conference, September 1979, pp 721–725.

(2) "Millimetre Wave Low Noise E-Plane Balanced Mixers Incorporating Planar MBE GaAs Mixer Diodes" by R. N. Bates et al, 1982 IEEE MTT-S Digest, pp 13–15.

(3) "Low-Noise Millimeter-Wave Receivers" by J. J. Whelehan, IEEE Trans. MTT-25, April 1977, pp 268–280.

(4) "Millimetre Integrated Circuits Suspended in the E-plane of Rectangular Waveguide" by P. J. Meier, IEEE Trans. MTT-26, October 1978, pp. 726–733.

(5) "A 26.5-to-40 GHz Planar Balanced Mixer" by U. H. Gysel, Proc. 5th European Microwave Conference, September 1975, pp. 491–495; and see also U.S. Pat. No. 4.032,849.

(6) "Broadband Planar Balanced Mixers for Millimetre-Wave Applications" by L. Bui and D. Ball, 1982 IEEE MTT-S Digest, pp. 204–205.

(7) "Wideband mm-Wave Mixers for EW Applications" by D. W. Ball and L. A. Bui, Microwave Journal, June 1982, pp 65–76.

However, in none of these references is there any suggestion of conductive connection means through the substrate between the pair of spaced conductors of the first transmission line and the ground conductor of the second transmission line.

BRIEF DESCRIPTION OF THE DRAWING

Embodiments of the invention will now be described, by way of example, with reference to a diagrammatic drawing, in which.

DESCRIPTION OF THE PREFERRED EMBODIMENT

Figure 1:
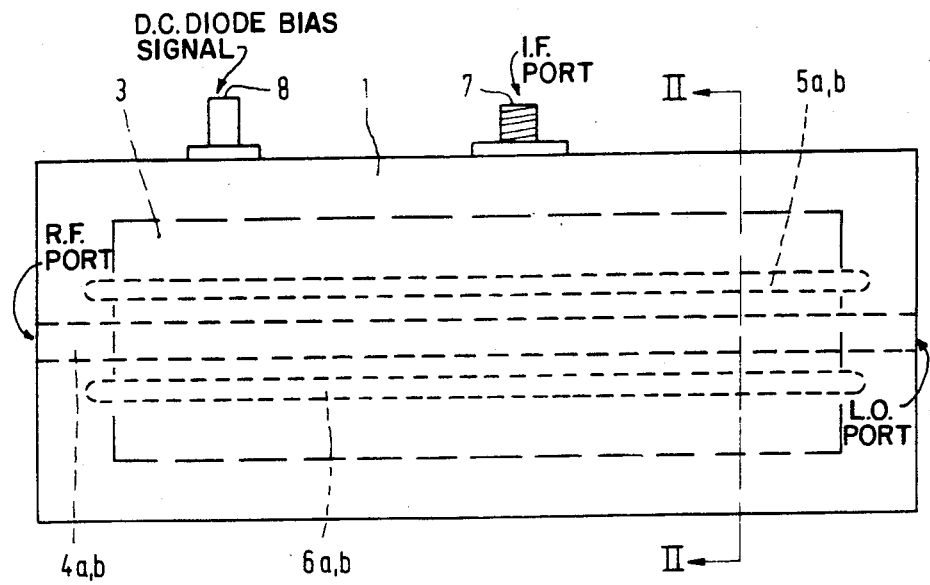
FIG. 1 is a side view of an R.F. mixer embodying the invention, the Figure showing a housing of the mixer and indicating the disposition therein of cavities and of a substrate.
Figure 2:
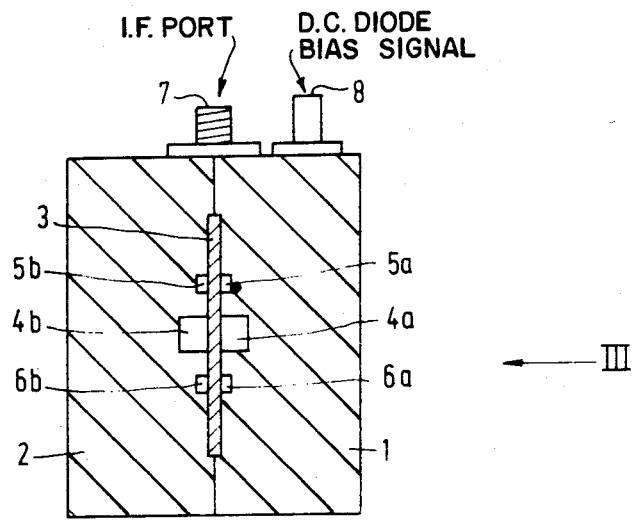
FIG. 2 is a transverse cross-sectional view on the line II—II in FIG. 1, also showing the disposition of the cavities and of the substrate.

Referring to FIGS. 1 and 2, the R.F. mixer comprises two metal housing members 1 and 2, and an insulating substrate 3 having a conductive layer on each of its two opposed major surfaces. The housing members 1 and 2 have a pair of opposed channels 4a, 4b formed in them, so that when they are secured together (by means not shown) with the substrate 3 between them, as shown in FIG. 2, the channels form a rectangular waveguide cavity in a central longitudinal plane of which the substrate is disposed, parallel to the narrow walls of the waveguide, i.e. substantially in the plane of the maximum electric field of the fundamental $TE_{10}$ mode in the waveguide. (For clarity, the thickness of the substrate has been exaggerated in FIG. 2) As indicated in FIG. 1, the substrate extends through most of the length of the housing, terminating a short distance from each end.

The housing members 1 and 2 have two further pairs of opposed channels 5a, 5b and 6a, 6b respectively. These channels extend parallel to the channels 4a, 4b over the whole length of the substrate, terminating beyond the ends thereof near each end of the housing so as to form closed cavities above and below the waveguide. They will be further described below.

In operation, an R.F. input signal and an L.O. signal are respectively supplied to opposite ends of the mixer (the left and right ends respectively in the relevant FIGS.), and an I.F. signal is extracted at a coaxial connector 7. A direct voltage for biasing diodes in the mixer is applied to a connector 8.

Figure 3A:
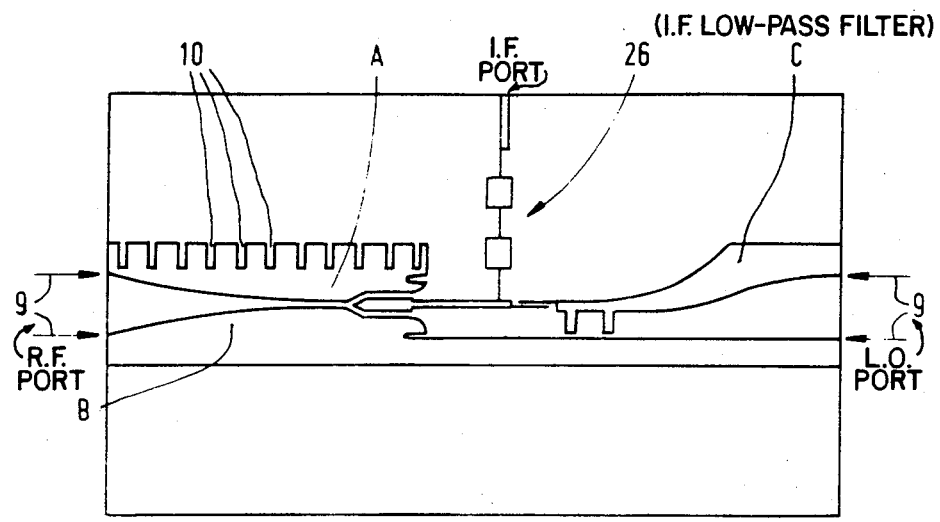
FIGS. 3A and 3B are schematic plan views of the substrate showing respectively the conductive layer patterns on the front and rear surfaces, viewed from the side shown in FIG. 1 and in the direction indicated by the arrow III in FIG. 2.
Figure 3B:
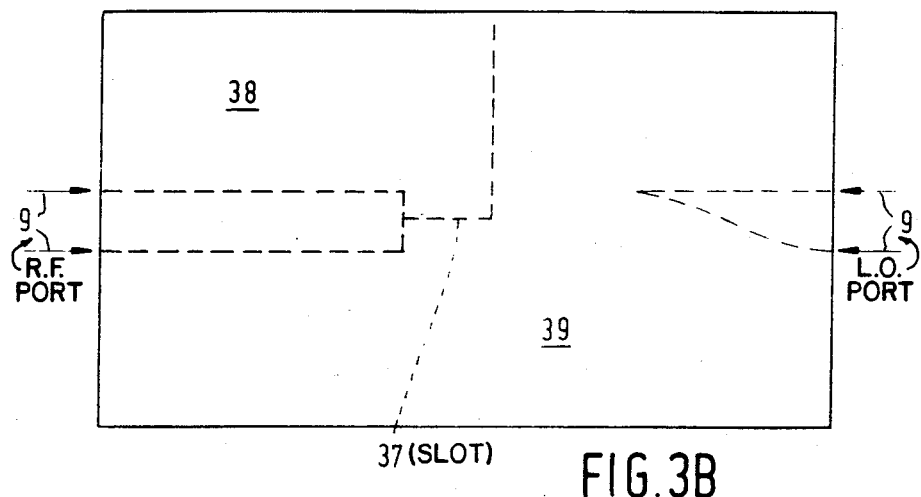

FIGS. 3A and 3B are schematic plan views of the whole substrate, viewed from the side of the mixer shown in FIG. 1 and in the direction of the arrow III in FIG. 2; the Figures show respectively the patterns of the conductive layers on the front and rear surfaces, the edges of the layers being denoted by continuous and broken lines respectively (for the time being disregarding in FIG. 3B the dashed line 37 which will be mentioned again later). The patterns intersect the planes of the upper and lower broad walls of the waveguide along horizontal lines (not drawn) extending between pairs of horizontally-opposed arrows 9 in the Figures. The conductive layer on the front surface is mainly confined to a region within and immediately adjacent the waveguide, while the conductive layer on the rear surface extends over the whole of that surface except for two regions of the waveguide.

It is necessary for certain portions of the conductive layer on the front surface of the substrate that extend in the waveguide, these portions being denoted A, B and C respectively, to be coupled to the waveguide housing at the frequencies of the R.F. and/or L.O. signals. To enhance this coupling and to inhibit the leakage of the R.F. and L.O. signals from the waveguide, the closed cavities formed by channels 5a, 5b and 6a, 6b above and below the waveguide respectively are dimensioned so that they are cut-off to all waveguide modes of propagation in the whole of the operating frequency range of the R.F. and L.O. signals and thus present an open-circuit to R.F. energy in this frequency range that might reach them. The portions A, B and C of the layer that are to be coupled to the housing extend between the housing members in engagement therewith up to the nearest wall of the respective closed cavity adjacent the waveguide, over a distance which is equal to a quarter of a wavelength in the substrate at the centre of the operating frequency range of the R.F. and L.O. signals, so that the open-circuit presented there by the respective closed cavity is transformed substantially to a short-circuit at the adjacent broad wall of the waveguide.

In this embodiment, portions B and C are D.C.-connected to the housing by conductive contact with the housing member 1, while portion A is separated from member 1 by a thin insulating layer (not shown), for example a film of Kapton (Trade Mark) 8 $\mu$m thick, so as to be isolated from the housing at D.C. but closely coupled therewith at the frequencies of the R.F. and L.O. signals. Except as mentioned later, the conductive layer on the rear surface of the substrate is in conductive contact with the housing member 2.

In order to inhibit resonant effects associated with the part of portion A that is engaged with the housing members and is D.C.-isolated from member 1 by the insulating layer, longitudinally-spaced transverse slots, of which a few are denoted 10, extend into the portion from the edge at the respective closed cavity almost up to the adjacent broad wall of the waveguide.

Other features which appear in FIGS. 3A and 3B will be described later.

Figure 4:
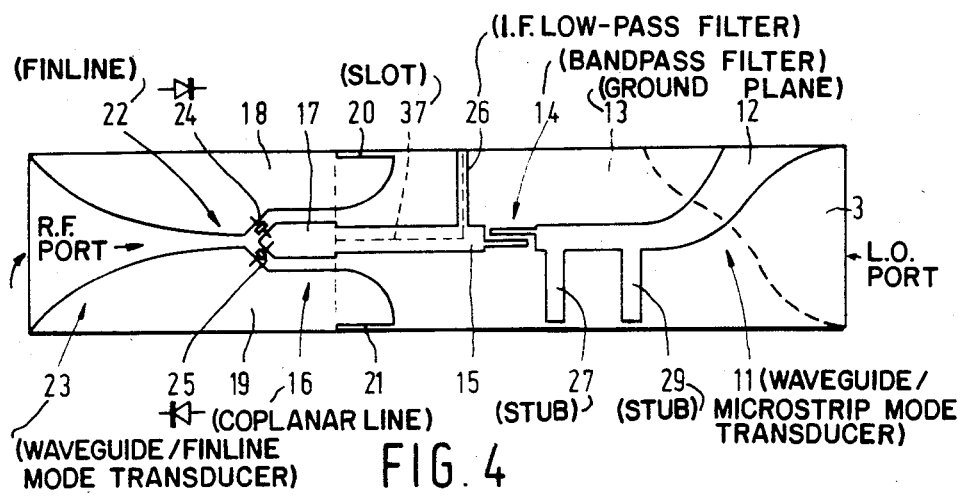
FIG. 4 is an enlarged plan view, not to scale, of the portion of the substrate that is situated in a waveguide cavity of the mixer.

FIG. 4 is an enlarged schematic view (not to scale) of the portion of the substrate that is disposed within the waveguide, again viewed from the side of the mixer shown in FIG. 1 and in the direction of the arrow III in FIG. 2. The uppermost and lowermost horizontal lines in the Figure indicate the intersection of the plane of the substrate with the planes of the upper and lower broad walls respectively of the waveguide. Considering the circuit from right to left (as drawn), the L.O. port of the mixer comprises a waveguide/microstrip mode transducer 11 comprising portions 12 and 13 of the conductive layers respectively on the front and rear surfaces of the subtrate. These portions extend away from the upper and lower broad walls of the waveguide, and along the waveguide, progressively becoming transversely narrower and broader, respectively, to form a microstrip line strip conductor and its ground plane, respectively; the strip conductor extends along the centre of the waveguide, and the ground plane extends across the whole height of the waveguide. The microstrip line is coupled by a band-pass filter 14 to a further length of microstrip line comprising a strip conductor 15 and the ground plane 13. The filter 14 comprises two adjacent transversely-spaced strips respectively connected to the strip conductor of the mode transducer 11 and to strip conductor 15.

At its end remote from the filter 14, the further length of microstrip line is coupled to a coplanar line (coplanar waveguide) 16 comprising a central conductor 17 separated by a circumferential gap from two transversely-opposed, outer ground conductors 18 and 19. The strip conductor 15 of the microstrip line is contiguous with the central conductor 17 of the coplanar line. The microstrip ground plane 13 on the rear surface of the substrate terminates, perpendicularly transverse to the waveguide, opposite the junction of strip conductor 15 and central conductor 17 on the front surface. The right-hand ends (as drawn) of the transversely-opposed ground conductors 18 and 19 on the front surface of the substrate overlap the microstrip ground plane 13 on the rear surface, tapering away fairly sharply as quadrant-like portions to the respective adjacent broad walls of the waveguide. Adjacent these walls, these portions of the conductors 18 and 19 are provided with respective longitudinal slots 20 and 21 to suppress spurious modes of propagation, the effective electrical length of each slot being a quarter of a wavelength at the frequency of the L.O. signal (or the centre of the L.O. signal frequency band if the mixer is designed for operation with L.O. signals of different frequencies).

As shown in FIGS. 3A and 4, the transversely-opposed ground conductors 18 and 19 also extend along the waveguide beyond the left-hand end (as drawn) of the coplanar line 16 to from successively a finline 22 and, as they taper away relatively gently to the respective broad walls of the waveguide, a finline/waveguide mode transducer 23 constituting the R.F. port of the mixer.

At the junction of the coplanar line 16 and the finline 22, two diodes 24 and 25 are connected in opposite respective electrical polarities (as indicated by the diode symbols adjacent their reference numbers) between the central conductor 17 of the coplanar line and the ground conductors 18 and 19. The length of the coplanar line 16 is a quarter of a wavelength at the centre of the R.F. signal frequency band so that the substantial short-circuit presented to the coplanar mode of propagation on the conductors 17, 18, 19 at the right-hand end of the coplanar line 16, where it is coupled to the microstrip line strip conductor 15, is transformed substantially to an open-circuit at the diodes 24 and 25 and therefore does not substantially affect the impedance presented at the diodes to a signal from the R.F. port. The diodes appear in series between the outer ground conductors 18 and 19.

The I.F. signal produced in the diodes 24 and 25 by the mixing of the R.F. and L.O. signals is extracted from the mixer via a microstrip low-pass filter 26 connected to strip conductor 15 at a T-junction adjacent band-pass filter 14. The low-pass filter 26 comprises a succession of five sections of line of alternately high and low impedances, each approximately a quarter of a wavelength long at the centre of the operating frequency band of the R.F. and L.O. signals; of these sections, only the first, high impedance section is located in the waveguide and hence only this section appears in FIG. 4, while the whole filter appears in FIG. 3A. The end of the filter remote from strip conductor 15 constitutes the I.F. port of the mixer and is connected to coaxial connector 7.

As described in greater detail in our co-pending British application No. 2,129,224A filed Aug. 27, 1982, to which the reader is referred and the entire contents of which are incorporated by reference herein, the mixer further comprises two short-circuited stubs 27 and 29 whose lengths and mutual spacing are each substantially a quarter wavelength at the L.O. frequency. The stubs have substantially no effect at the L.O. frequency but substantially short-circuit the mode transducer 11 at the intermediate frequency and thereby inhibit the mode transducer from acting as a stub weakly coupled to the rest of the mixer circuit at the intermediate frequency.

Apart from the features mentioned in the preceding paragraph, the mixer circuit as so far described is similar to the mixer circuits known from references (1) and (2)

above. In such a circuit arrangement, the ground plane 13 of the microstrip line comprising strip conductor 15 is coupled at R.F. to ground conductors 18 and 19 of the coplanar line 16 by virtue of each of the conductors 18 and 19 overlapping ground plane 13 over a substantial respective area and thus being coupled by capacitive or proximity coupling through the substrate. This is believed to be satisfactory for the L.O. signal if for example the frequency thereof is in the range of 60–90 GHz. However, the situation is different for the I.F. signal. At relatively low frequencies, for example up to frequencies of a few hundred MHz, a ground return path of adequately low impedance for the I.F. signal can be obtained by a capacitor connected (for example, outside the waveguide but within the housing, e.g. in a recess) between the bias supply and ground. As the frequency increases, the impedance presented by such a path, which is necessarily rather long, becomes significant and may introduce losses and/or resonant effects. It is known from reference (5) above to connect a capacitor directly between a D.C.-isolated fin and the housing (ground) to provide an I.F. signal ground return path, but currently-available commercial capacitors with suitable capacitances are unsuitable for use above 5–10 GHz in view of their significant inductance and/or self-resonance.

Figure 5:
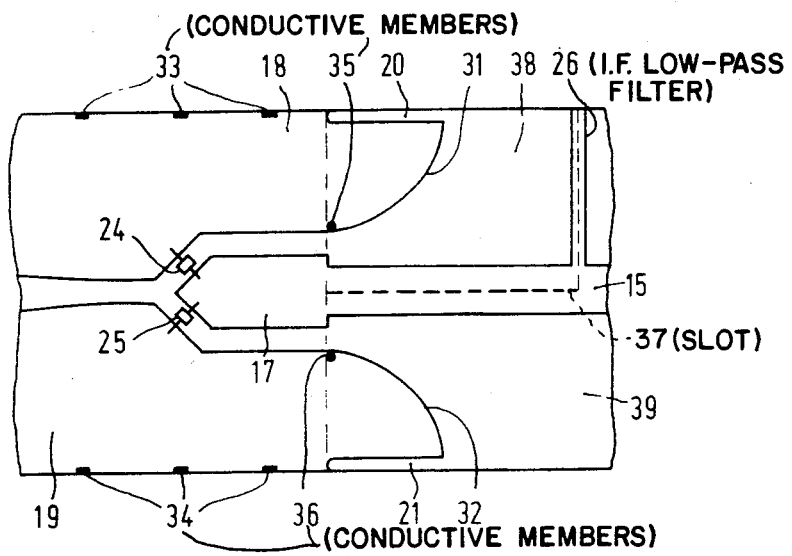
FIG. 5 is a further enlarged plan view, not to scale, of part of the portion of the substrate shown in FIG. 4.

For relatively high intermediate frequencies, for example at least in a range above 10 GHz, it is preferable to provide direct conductive connection means through the substrate between the ground conductors of the coplanar line and the ground plane of the microstrip line. Referring to FIG. 5 which is an enlarged view, not to scale, of a portion of the substrate in the region of the coplanar line, and which includes details that for the sake of clarity have been omitted from previous Figures, such conductive connection means may for example comprise a pair of continuous broad conductive foils which each extend through a respective slot in the substrate along the curved edges 31 and 32 of the conductors 18 and 19 and which are conductively bonded, for example with conductive epoxy adhesive, to the ground conductors 18 and 19 respectively on the front surface of the substrate and to the ground plane 13 on the rear surface.

Alternatively, a conductive connection means through the substrate may be disposed at each of the upper and lower broad walls of the waveguide; the conductive connection means can include respective pluralities of conductive members distributed discretely in a respective plurality of spaced locations such as 33 and 34. (With such a configuration, conductive connections at a respective plurality of spaced locations were found to give better results than a conductive connection at a respective single location.) Each connection may comprise a respective narrow conductive foil extending through a slot in the substrate at each location, the foil being conductively bonded to the respective ground conductor of the coplanar line and to the ground plane of the microstrip line by, for example, conductive epoxy adhesive or thermo-compression bonding.

In each of the two above-described forms of conductive connection means, the configuration thereof (continuous or distributed at a plurality of spaced locations) has the advantage of tending to reduce the net inductive impedance presented by the conductive connection means.

Conductive connections through the substrate may be disposed substantially at the locations 35 and 36 where the respective edges (horizontal as drawn), nearest the centre of the waveguide, of each of the ground conductors 18 and 19 on the front surface of the substrate cross the edge (vertical as drawn) of the ground plane 13 on the rear surface of the substrate. Such a connection, which may be a discrete connection at the respective location or part of a linewise continuous connection e.g. as described above with reference to the curved edges 31 and 32, will substantially minimize the conductive path length between each of the diodes and the region of the ground plane 13 that is substantially juxtaposed to the end of the strip conductor 15 connected to the coplanar line centre conductor 17.

In a further alternative arrangement, the ground plane 13 may, instead of terminating in an edge perpendicularly transverse to the waveguide opposite the junction of conductors 15 and 17, extend further along the waveguide; it may, for example, conform to the shapes of the ground conductors 18 and 19, and the R.F. port of the mixer may thus effectively be formed in bilateral rather than unilateral finline. The ground plane will then overlap the conductors 18 and 19 over their whole areas. One or more conductive connections may be disposed in or at the periphery of each of the areas of overlap. Suitably, a respective conductive connection is provided adjacent each of the diodes; one or more further connections may be provided, for example along the facing edges of the bilateral finline conductors.

Each of the four arrangements of conductive connection means described in the preceding five paragraphs may be used alone or in combination with any one or more of the other arrangments. In experimental work on embodiments of the invention, the first and last-mentioned of the four arrangements were found to be particularly successful.

It may be desirable to D.C-bias the diodes in operation, especially if they have a relatively large barrier height, being for example Gallium Arsenide devices; a particular value of conversion loss obtainable without D.C. bias will become obtainable at a smaller L.O. signal power with D.C. bias. This may be especially significant when the local oscillator operates in the millimeter wavelength range (since currently-available oscillators for this range tend to have only a restricted power output) and/or when it may be desirable to supply a plurality of mixer circuits from a single local oscillator. The inclusion of the conductive connection means in the mixer circuit as so far described would prevent the application of D.C. bias to the diodes 24 and 25, since both diodes would be D.C.-connected to the ground plane 13 and since the diodes are connected in series. In order to enable D.C. bias to be applied, the mixer circuit includes slot means 37 in the ground plane 13; the disposition of the slot means is indicated in FIGS. 3B, 4 and 5 by a single line of short dashes. The slot means, which are constituted by a single continuous slot some 20 μm wide formed in the conductive layer on the rear surface of the substrate with a laser, mutually isolate at D.C. two portions 38 and 39 of the ground plane 13 to which the diodes 24 and 25 are respectively connected and across which a direct voltage for biasing the diodes is applied; portion 38 is D.C.-isolated from the adjacent housing member 2 by a thin insulating layer (not shown). At R.F., the two portions 38 and 39 are mutually coupled, in particular by capacitive coupling via the conductive material of the housing members 1 and 2. This R.F. circuit arrangement is described in greater detail in our co-pending U.S. application Ser. No. 521,501 filed Aug. 8, 1983, to which the reader is referred and the entire contents of which are incorporated by reference herein.

It may be noted that an R.F. mixer comprising an insulating substrate in an E-plane of a rectangular waveguide and utilizing conductive connections through the substrate between conductive layers on opposite major surfaces thereof is known from U.S. Pat. No. 4,291,415 and the paper "A Novel Broadband Double Balanced Mixer for the 18–40 GHz Range" by A. Blaisdell, R. Geoffroy, and H. Howe, 1982 IEEE MTT-S Digest, pp 33–35. However, the double-balanced arrangement of this mixer is unsuitable for a single-balanced mixer, the conductive connections through the substrate are provided essentially to terminate a balanced transmission line in such a manner as to present an open-circuit at the diodes, and the ground return path between the diodes and the ground conductor of the I.F. output line, in this case a coaxial line, is of substantial length. Furthermore, the U.S. patent proposes the use, if the diodes are to be biased, of R. F. bypass capacitors, formed in situ, which not only are in the path of the R.F., L.O. and I.F. signals but also would be difficult to make.

Although the embodiments of the invention described above with reference to the drawings use a single insulating sheet as substrate means, the latter may comprise a plurality of insulating sheets, for example as described in reference (5) above.

It is not essential for a mixer circuit embodying the invention to include a coplanar or comparable line between the balanced first line and the unbalanced second line (finline and microstrip respectively in the above-described embodiment). For example, the above-mentioned references (6) and (7) disclose mixers comprising junction arrangements in which two diodes are connected directly between a strip conductor of an unbalanced microstrip or suspended substrate line and the pair of conductors of a balanced finline. It should also be noted that the unbalanced line may be a suspended substrate line (or suspended stripline) rather than a microstrip line, for example as disclosed in reference (5) and (6) above.

An embodiment of the invention may be used for frequency-translating R.F. signals in the 60–90 GHz band (there being no suitable amplifiers currently available to cover the whole of this band) to I.F. signals in the 6–18 GHz band (for which suitable amplifiers are available).

An R.F. mixer circuit embodying the invention may also be used as a frequency up-converter, input signals of suitable frequencies being supplied to the two ports designated the L.O. and I.F. ports in the previously described embodiment, and an output signal of higher frequency than each input signal being derived from the port designated the R.F. port.

We claim:

1. An R.F. balanced mixer comprising insulating substrate means having two opposed major surfaces, the mixer having first and second transmission lines, wherein the first transmission line is a balanced transmission line comprising a pair of spaced conductors on a first of said major surfaces, wherein the second transmission line is an unbalanced transmission line comprising a strip conductor on one of said major surfaces and a ground conductor on the other major surface, the mixer further comprising two diodes electrically connected between said strip conductor of the second transmission line and respective ones of the spaced conductors of the first transmission line, the arrangement of the first and second transmission lines and the diodes being operable as a 180 degree hybrid junction, wherein in operation the first transmission line couples a signal at a first frequency to or from the diodes, and wherein in operation the second transmission line couples a signal at a second frequency to the diodes and couples a signal at a third frequency equal to the difference between the first and second frequencies to or from the diodes, characterized in that said strip conductor of the second transmission line is on said first major surface of the substrate means and in that coupling means comprising conductive connection means extends through the substrate means from each of said spaced conductors to said ground conductor for coupling said pair of spaced conductors of the first transmission line through the substrate means to said ground conductor of the second transmission line, said coupling means providing a low impedance ground return path at said second and third frequencies.

2. A mixer as claimed in claim 1, characterised in that said coupling means present said low impedance ground return path at said second frequency over a broad range of values thereof.

3. A mixer as claimed in claim 1 or 2 wherein each of said pair of spaced conductors overlaps said ground conductor over a respective substantial area, characterized in that each of said conductive connection means is disposed in or at the periphery of the respective spaced conductors.

4. A mixer as claimed in claim 3, characterised in that each of said conductive connection means comprises a plurality of discrete conductive members distributed along the respective periphery.

5. A mixer as claimed in claim 3, characterized in that each of said conductive connection means comprises a continuous conductive member extending along the respective periphery.

6. A mixer as claimed in claim 1 or 2, characterised in that each of said conductive means is disposed so as to substantially minimize the conductive ground return path length between each diode and a region of said ground conductor substantially juxtaposed to an end of said strip conductor adjacent the diodes.

7. A mixer as claimed in claim 1 or 2 wherein said ground conductor is a ground plane on the second major surface of the substrate means, characterised in that said ground plane comprises two portions separated by slot means to effect mutual D.C. isolation of said portions, and in that each of said diodes is electrically connected by one of said conductive connection means to a respective one of said portions, thereby facilitating D.C. biasing of the diodes.

* * * * *

UNITED STATES PATENT AND TRADEMARK OFFICE
CERTIFICATE OF CORRECTION

PATENT NO. : 4,542,535
DATED : September 17, 1985
INVENTOR(S) : ROBERT N. BATES AND PHILIP M. BALLARD It is certified that error appears in the above—identified patent and that said Letters Patent is hereby corrected as shown below:

In The Claims:

Claim 6, line 2, after "conductive" insert
--connection--

Signed and Sealed this

Eighth Day of April 1986

[SEAL]

Attest:

DONALD J. QUIGG

Attesting Officer

Commissioner of Patents and Trademarks